United States Patent
Wensel

[11] Patent Number: 5,885,854
[45] Date of Patent: Mar. 23, 1999

[54] METHOD FOR APPLICATION OF DE-WETTING MATERIAL FOR GLOB TOP APPLICATIONS

[75] Inventor: Richard W. Wensel, Boise, Id.

[73] Assignee: Micron Technology, Inc., Boise, Id.

[21] Appl. No.: 823,214

[22] Filed: Mar. 24, 1997

Related U.S. Application Data

[62] Division of Ser. No. 747,229, Nov. 12, 1996.

[51] Int. Cl.$^6$ .................................................. H01L 21/44
[52] U.S. Cl. ........................... 438/127; 438/124; 438/126
[58] Field of Search ................................. 428/124, 129, 428/126, 127

[56] References Cited

U.S. PATENT DOCUMENTS

| | | | |
|---|---|---|---|
| 4,143,456 | 3/1979 | Inoue | 438/126 |
| 4,218,701 | 8/1980 | Shirasaki | 438/126 |
| 4,300,153 | 11/1981 | Hayakawa et al. | |
| 4,507,675 | 3/1985 | Fujii et al. | |
| 4,843,036 | 6/1989 | Schmidt et al. | 438/126 |
| 4,921,160 | 5/1990 | Flynn et al. | |
| 4,942,140 | 7/1990 | Ootsuki et al. | 438/126 |
| 5,031,022 | 7/1991 | Yamamotot et al. | 357/70 |
| 5,051,275 | 9/1991 | Wong | |
| 5,068,712 | 11/1991 | Murakami et al. | 357/72 |
| 5,085,913 | 2/1992 | Wong | |
| 5,173,766 | 12/1992 | Long et al. | 257/687 |
| 5,386,342 | 1/1995 | Rostoker | 361/749 |
| 5,577,819 | 11/1996 | Knecht | 29/827 |

FOREIGN PATENT DOCUMENTS

| | | | |
|---|---|---|---|
| 60-161642 | 8/1985 | Japan | 257/667 |
| 1-107562 | 4/1989 | Japan | 257/667 |
| 2-102563 | 4/1990 | Japan | 257/667 |
| 5-109929 | 4/1993 | Japan | 257/667 |
| 6-169033 | 6/1994 | Japan | 257/667 |

*Primary Examiner*—Kevin M. Picardat
*Attorney, Agent, or Firm*—Trask, Britt & Rossa

[57] ABSTRACT

A method of forming high definition elements for electrical and electronic devices, substrates, and other components from or including viscous material. The method includes applying a de-wetting agent to a surface bordering the viscous material prior to applying the viscous material. The de-wetting agent causes the viscous material to "bead-up."

10 Claims, 6 Drawing Sheets

5,885,854

METHOD FOR APPLICATION OF DE-WETTING MATERIAL FOR GLOB TOP APPLICATIONS

PRIOR APPLICATION

This is a divisional of application Ser. No. 08/747,229, filed Nov. 12, 1996, pending.

BACKGROUND OF THE INVENTION

1. Field of the Invention

The present invention relates to maintaining the structure of viscous materials applied to semiconductor components. More particularly, the present invention relates to glob top application wherein viscous encapsulant material is prevented from flowing when applied to semiconductor components by a layer of de-wetting agent.

2. State of the Art

Higher performance, lower cost, increased miniaturization of components, and greater packaging density of integrated circuits are goals of the computer industry. As components become smaller and smaller, tolerances for all semiconductor structures (circuitry traces, printed circuit board and flip chip bumps, adhesive structures for lead attachment, encapsulation structures, and the like) become more and more stringent. However, because of the characteristics of the materials (generally viscous materials) used in forming the semiconductor structures, it is becoming difficult to form smaller circuitry traces. conductive polymer bumps with closer pitches, adequate adhesive structures for leads attachment, and adequate encapsulation structures.

Material flow problems exist in the application of encapsulation materials. After a semiconductor device is attached to a printed circuit board ("PCB") by any known chip-on-board ("COB") technique, the semiconductor device is usually encapsulated with a viscous liquid or gel insulative material (e.g., silicones, polyimides, epoxies, plastics, and the like). This encapsulation (depending on its formulation) allows the semiconductor device to better withstand exposure to a wide variety of environmental conditions such as moisture, ion impingements, heat, and abrasion.

One technique used in the industry is illustrated in FIGS. 7–9. A stencil 50 is placed on a conductor-carrying substrate such as a PCB 52 such that an open area 54 in the stencil 50 exposes a semiconductor device 56 to be encapsulated as well as a portion of tile substrate 52 surrounding the semiconductor device 56, as shown in FIG. 7. An encapsulant material 58 is then extruded from a nozzle 60 into the open area 54, as shown in FIG. 8. However, when the stencil 50 is removed, the encapsulant material 58 sags or flows laterally under the force of gravity, as shown in FIG. 9. This flowing thins the encapsulant material 58 on the top surface 62 of the semiconductor device 56, which may result in inadequate protection for the semiconductor device 56, particularly in the vicinity of the upper peripheral edges 64. Using a thicker encapsulant material would help minimize the amount of flow; however, thicker encapsulant materials are difficult to extrude through a nozzle and are subject to the formation of voids such as air pockets. These voids can cause delamination of the encapsulant from the PCB 52 or the semiconductor device 56, and if the voids contain moisture, during subsequent processing steps the encapsulant material may be heated to the point at which the moisture, usually in condensed form, vaporizes. Vaporization causes what is known as a "popcorn effect" (i.e., a small explosion) which at least damages (i.e., cracks) the encapsulation material and more often results in contamination of the device and usually irreparable damage thereto, effectively destroying the semiconductor device as a usable assembly.

In an effort to cope with the encapsulant flow problem, the damming technique shown in FIGS. 10–12 has been used. A high viscosity material 66 is extruded through a nozzle 68 directly onto a PCB or other carrier substrate 70 to form a dam 72 around a semiconductor device 74, as shown in FIG. 10, or a stencil can be placed on the substrate 70 such that a continuous aperture in the stencil exposes an area around the semiconductor device 74 to be dammed. The high viscosity material 66 is then disposed into the stencil aperture to form the dam 72. A low viscosity encapsulation material 76 is then flowed into the area bounded by the dam 72 by a second nozzle 78 such as a syringe or spray applicator, as shown in FIG. 11. The dam 72 prevents the low viscosity encapsulation material 76 from flowing and defines the periphery of the dammed encapsulated structure 80, shown in FIG. 12, after curing of material 76. The dam 72 can be made with high viscosity material without adverse consequences since it does not directly contact the semiconductor device 74 or form any part, other than a damming function, of the encapsulation of the semiconductor device 74. Although this damming technique is an effective means of containing the low viscosity encapsulation material 76, it requires somewhat duplicative processing steps as well as additional material and equipment, all of which increase the cost of the fabricated component.

Thus, it can be appreciated that it would be advantageous to develop a technique to control viscous material flow in the formation of semiconductor components while using commercially-available, widely-practiced semiconductor device fabrication techniques.

SUMMARY OF THE INVENTION

The present invention relates to a method for maintaining viscous material boundary definition by using a de-wetting agent that causes the viscous material to "bead up" as it reaches the area that has been coated with the de-wetting agent.

The present invention comprises using standard techniques for applying viscous materials (e.g., spin on, spray on, roll on, screen printed, and the like) in the fabrication of semiconductor device elements, such as encapsulation structures and the like. A de-wetting agent is applied to the surface of a carrier substrate such as a PCB so that the de-wetting agent borders the area to be encapsulated. A stencil or other appropriate masking technique is used to define the area where the de-wetting agent is to be applied and to prevent the application of the de-wetting agent to other areas. Alternatively, a de-wetting film containing an aperture for the semiconductor device site may be applied to the surface of the carrier substrate. The encapsulating material is then applied to the area to be encapsulated. The de-wetting agent prevents the encapsulation material from flowing and causes the encapsulation material to "bead up," thus forming a large angle of repose with respect to the surface of the carrier substrate.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
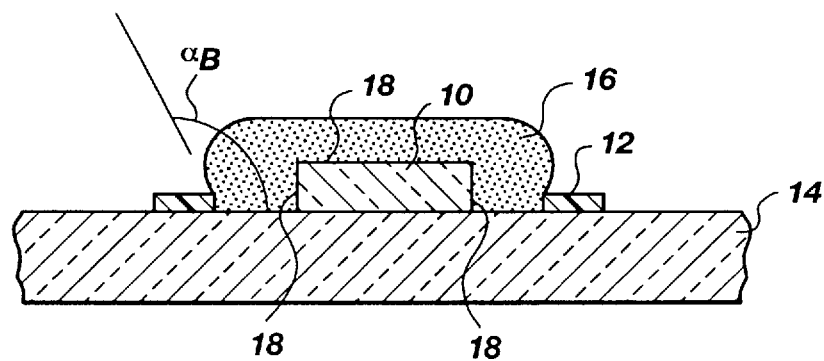
FIG. 1 is a cross-sectional view of an encapsulated semiconductor device formed by the de-wetting method of the present invention.

FIG. 1 illustrates a semiconductor device 10 encapsulated by the de-wetting method of the present invention. It is, of course, understood that any semiconductor device component, including not only semiconductor dice, but also conductive traces, resistors, capacitors, transistors, diodes, and other components requiring the protection of an encapsulant, may be encapsulated using the de-wetting method of the present invention. For the sake of convenience, however, the term "semiconductor device" will be used to encompass all such components. In the present invention, a thin film or layer of de-wetting agent 12 applied to the carrier substrate 14 causes the encapsulation material 16 to "bead up" Thus, where the encapsulation material 16 meets the de-wetting agent 12, the encapsulation material 16 "beads" rather than flows. Therefore, an adequate amount or thickness of encapsulation material 16 remains disposed over exterior surfaces 18 of the semiconductor device 10 in order to protect the semiconductor device 10. In this situation, an angle of repose $\alpha_b$ of the encapsulation material 16 may even be greater than 90 degrees, as shown in FIG. 1. The de-wetting agent 12 is applied to the substrate 14 in such a manner to border the area to be encapsulated as show in FIG. 1.

Figure 2:
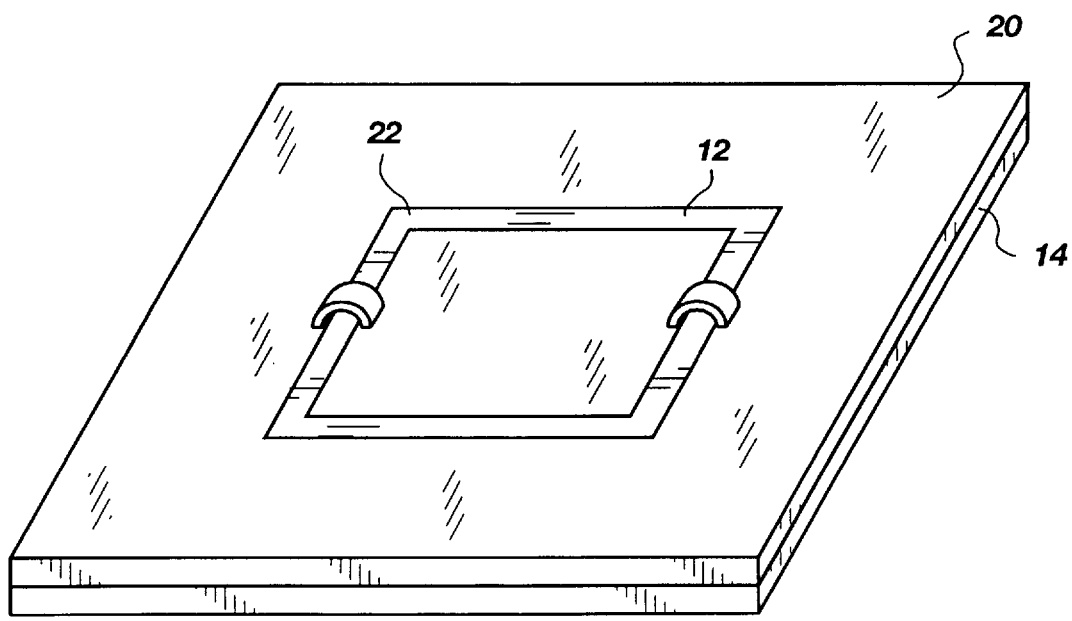
FIGS. 2–4 are oblique views of a technique of forming an encapsulant layer on a semiconductor device using the de-wetting technique of the present invention wherein a de-wetting agent is applied with a stencil.
Figure 3:
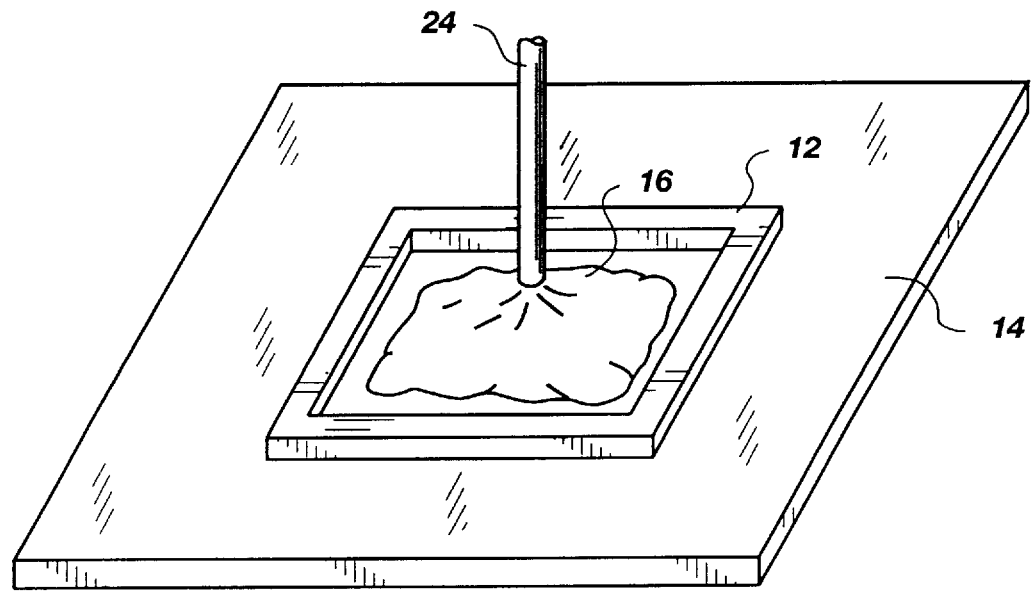
Figure 4:
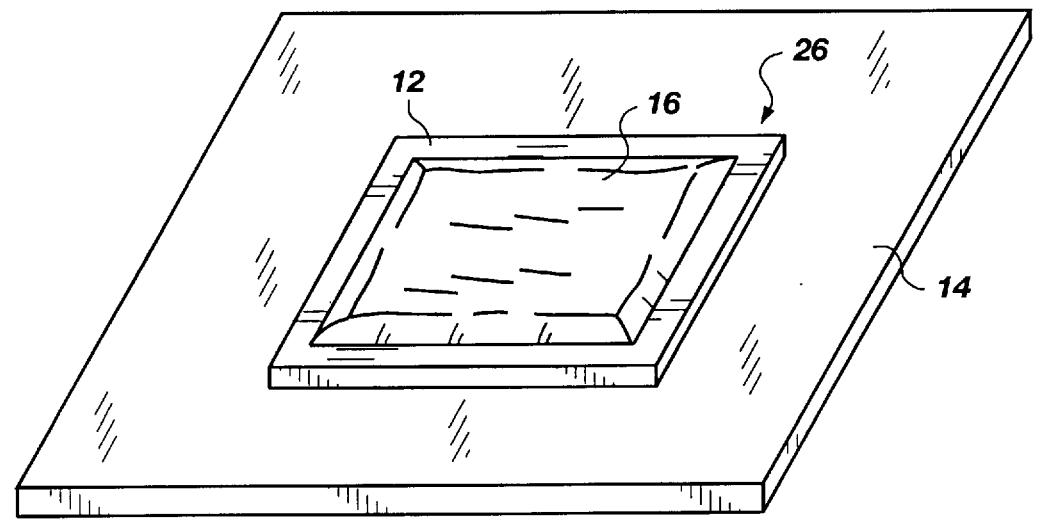

The encapsulation method of the present invention is illustrated in FIGS. 2–4 (components common to both FIG. 1 and FIGS. 2–4 retain the same numeric designation). A stencil 20 is placed on a conductor-carrying substrate 14, such as a PCB, such that a continuous aperture 22 in the stencil 20 exposes an area of the substrate 14 around the semiconductor device to be encapsulated, as shown in FIG. 2. The de-wetting agent 12, such as silicone, latex, high-molecular weight wax, and the like, is then applied through the aperture 22 in the stencil 20 and onto the surface of the substrate 14. It is of course understood that the de-wetting agent 12 may be applied without a stencil by any means such as precision spraying, screen printing, pouring, extruding, stamping, rolling and the like. When the stencil 20 is removed, a thin film of de-wetting agent 12 remains on the surface of the substrate 14 and borders the area to be encapsulated, as shown in FIG. 3 (thickness of film 12 exaggerated for clarity). The encapsulation material 16, preferably having a low viscosity, is then extruded, flowed, or sprayed by a nozzle 24 into the area bounded by the de-wetting agent 12, as shown in FIG. 3. The encapsulation material 16 may also be stencil printed. The de-wetting agent 12 prevents the low viscosity encapsulation material 16 from flowing, to form the encapsulation structure 26 shown in FIG. 4. By preventing the flow of the encapsulant material 16, the encapsulant material 16 on the top and side surfaces 18 of the semiconductor device 10 (shown in FIG. 1) remains thick enough to provide adequate protection for the semiconductor device 10.

Figure 5:
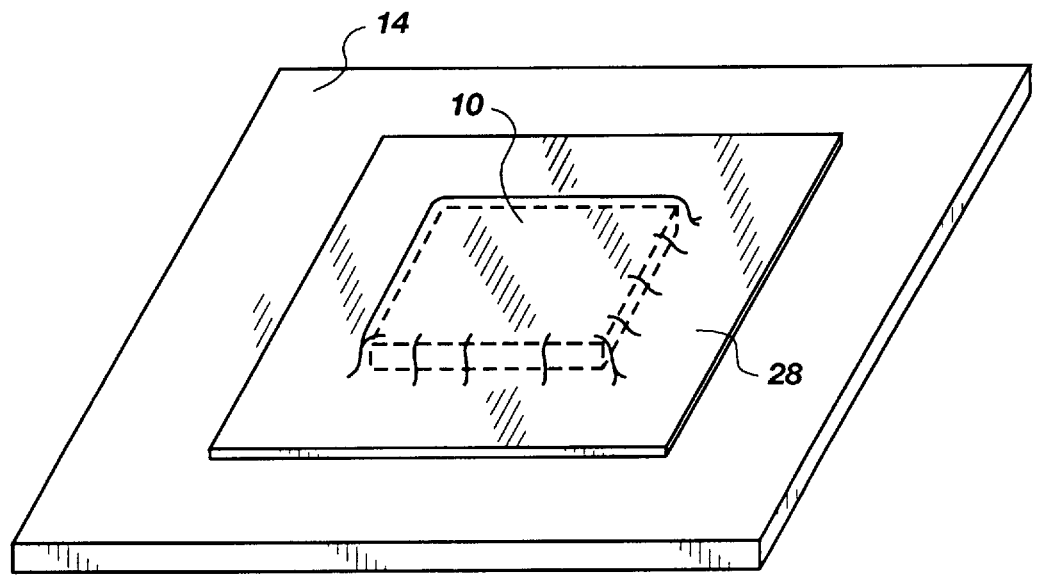
FIG. 5 is an oblique view of a technique of forming an encapsulant layer on a semiconductor device using the de-wetting technique of the present invention wherein a de-wetting agent is applied after the semiconductor device has been masked.

Alternatively, the encapsulation method of the present invention may be performed by masking the semiconductor device before applying the de-wetting agent as shown in FIG. 5. The encapsulation method illustrated in FIGS. 1–4 is similar to the method illustrated in FIG. 5, therefore components common to both FIGS. 1–4 and 5 retain the same numeric designation. FIG. 5 differs from FIGS. 1–4 only in the use of masking material rather than the use of a stencil. The semiconductor device 10 (shown in shadow) and an appropriate area surrounding the semiconductor device 10 is masked off with a masking material 28. The masking material 28 may be a physical masking material, such as a piece of masking tape, or a resist-type mask material.

After the masking material 28 is applied over the semiconductor device 10 and surrounding area, a liquefied de-wetting agent 16 (not shown) is applied over the surface of the substrate 14 and potentially all or a portion of the masking material 28, as by spraying. The masking material 28 is then removed either physically, for the physical masking material, or with an appropriate solvent, for the resist-type mask material, which will wash away the resist-type mask material without removing the de-wetting agent adhered to substrate 14. After the masking material 28 is removed, the encapsulation material is then applied over the semiconductor device 10 in a manner discussed above.

Figure 6:
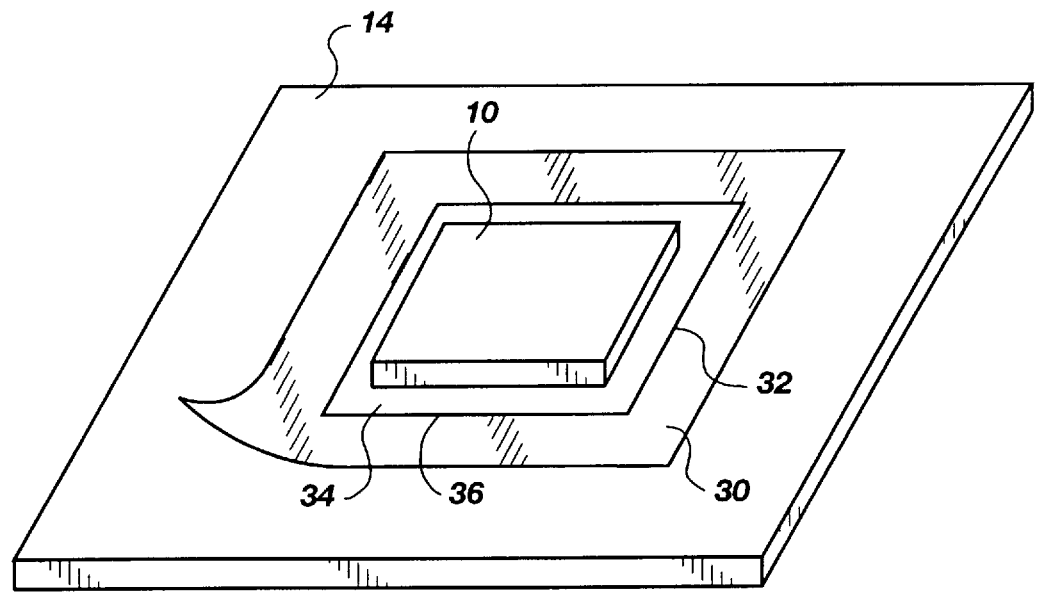
FIG. 6 is an oblique view of a technique of forming an encapsulant layer on a semiconductor device using the de-wetting technique of the present invention wherein a de-wetting agent is applied as a film.
Figure 7:
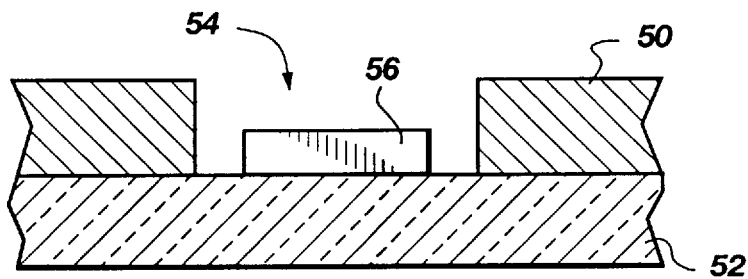
FIGS. 7–9 are side cross-sectional views of a technique of forming an encapsulant layer on a semiconductor device using a stencil.
Figure 8:
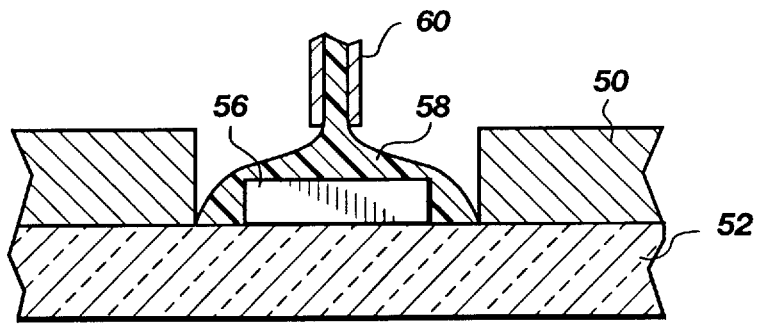

Alternatively, the encapsulation method of the present invention may be performed by using a de-wetting film to surround the semiconductor device instead of applying a liquid de-wetting agent as shown in FIG. 6. The encapsulation method illustrated in FIGS. 1–5 is similar to the method illustrated in FIG. 6, therefore components common to both FIGS. 1–5 and 6 retain the same numeric designation. FIG. 6 differs from FIGS. 1–5 only in the use of a predimensioned de-wetting agent in film form rather than the use of a stencil or masking to define a de-wetting agent boundary. A de-wetting film 30 is applied to the surface of the substrate 14. The de-wetting film 30 has an aperture 32 corresponding to the semiconductor device 10 and an appropriate surrounding area 34, the semiconductor device site 36. Although the de-wetting film 30 shown in FIG. 6 has a single aperture 32, it is, of course, understood that the film 30 may be large enough to cover the entire surface of the substrate 14 and contain multiple apertures corresponding to all semiconductor devices on the substrate. After the de-wetting film 30 has been applied to the surface of the substrate 14, a low viscosity encapsulation material 16 is then extruded, flowed, or sprayed into the area bounded by the de-wetting film 30.

Although the illustrated embodiment shows the de-wetting agent surrounding the semiconductor device, it is, of course, understood that the de-wetting agent need not completely surround the semiconductor device, although such a configuration is preferred as not requiring dams or other protrusions to contain a portion of the encapsulant. The pattern in which the de-wetting agent is applied will, of course, depend on the particular application.

The following brief explanation is intended to afford the reader a better understanding of the phenomena of "surface tension" and "wetting" as employed in the present invention. According to the theory of molecular attraction, molecules of liquid in the interior of the liquid are subject to equal forces of attraction from other molecules on all sides. Molecules on the surface of the liquid are subjected to these forces only on the liquid side. As a result, the molecules on the surface are pulled inward and closer together. Thus, the surface of the liquid can be described as behaving like a stretched membrane trying to contract to the smallest possible surface area. The liquid surface exerts tension on adjacent portions of the surface or on other objects in contact with the liquid. This tension is defined as surface tension. The magnitude of the surface tension at a liquid-solid interface depends on the relative amounts of attraction between the liquid molecules themselves and between the liquid and solid molecules.

A liquid is said to "wet" a solid when the attraction between the liquid and solid molecules, the adhesive force, is greater than the internal attraction between the liquid molecules themselves, the cohesive force. The surface of the liquid forms an angle of repose, $\alpha$, with respect to the surface of the solid. When the angle of repose, $\alpha$, is less than 90 degrees, wetting occurs. When the angle of repose, $\alpha$, is equal to or greater than 90 degrees, non-wetting occurs. Non-wetting occurs when the attraction between the liquid and solid molecules, the adhesive force, is less than the internal attraction between the liquid molecules themselves, the cohesive force. Thus, a de-wetting agent is a substance such that the attraction between the encapsulant molecules and the de-wetting agent molecules, or the adhesive force, is less than the internal attraction between the encapsulation molecules themselves, or the cohesive force.

Figure 9:
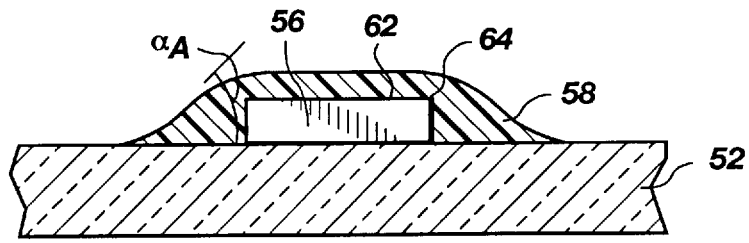
Figure 10:
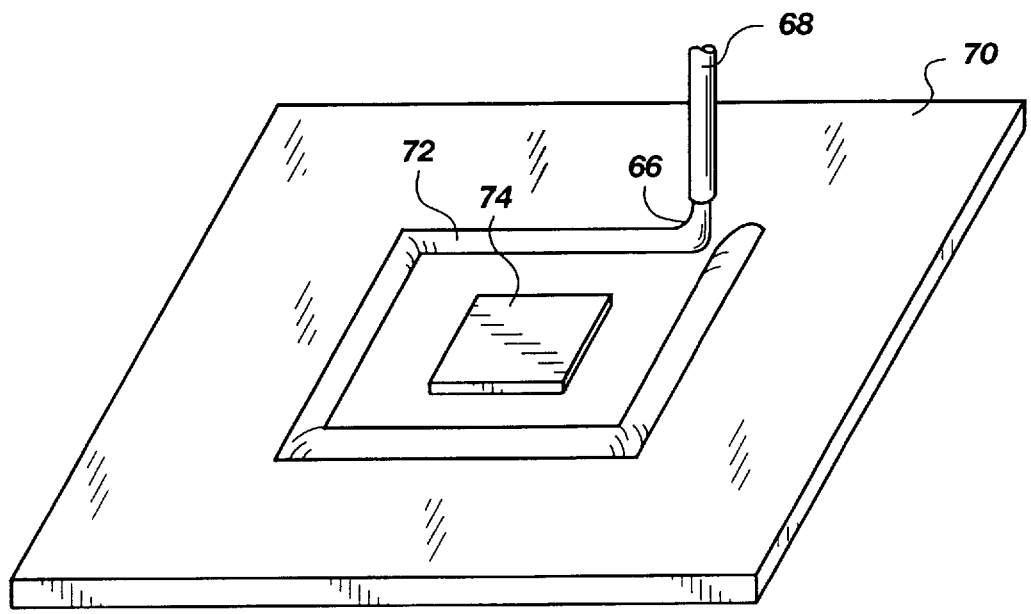
FIGS. 10–12 are oblique views of a technique of forming an encapsulant layer on a semiconductor device using high viscosity material dams.
Figure 11:
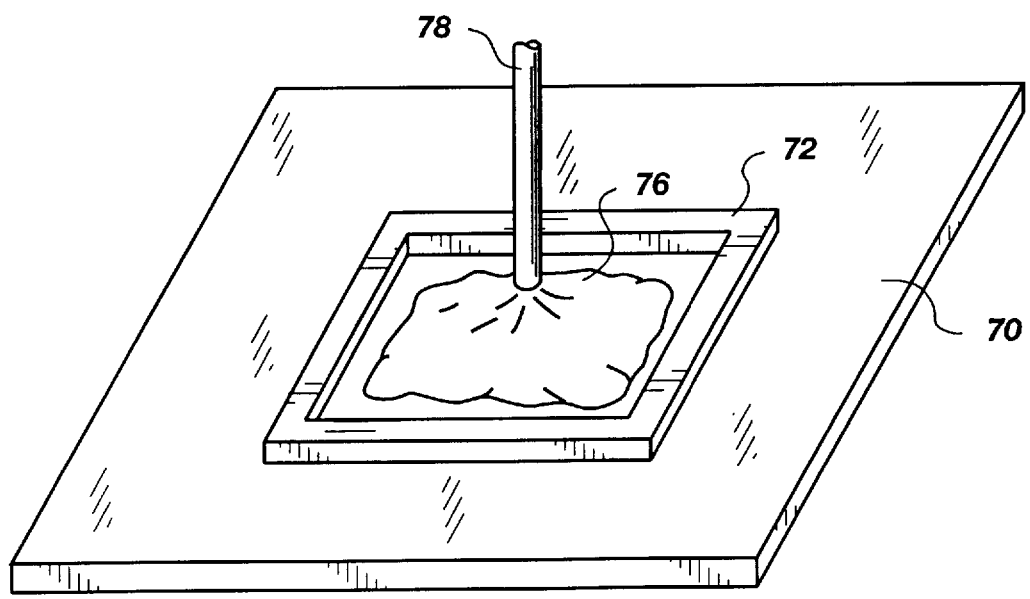
Figure 12:
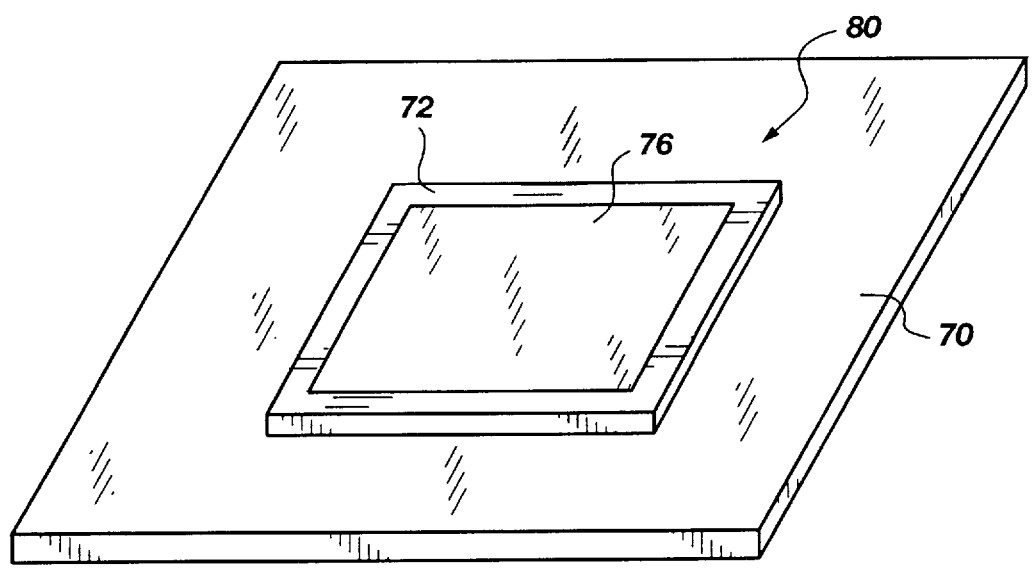

FIG. 9 illustrates a semiconductor device 56 encapsulated by the stencil method without the use of a de-wetting agent. The surface of the encapsulation material 58 forms an angle of repose, $\alpha_A$, with respect to the surface of the substrate 52. If the encapsulation material has a low viscosity, it flows or sags as shown in FIG. 9. In addition, the angle of repose, $\alpha_A$, is less than 90 degrees and the encapsulation material 58 is said to "wet" the substrate 52. This wetting or flowing thins the encapsulant material on the top surface of the semiconductor device 56 and on the upper edges thereof, which may result in inadequate protection for the semiconductor device.

A larger angle of repose, $\alpha_A$, may be obtained by using a higher viscosity encapsulation material. A higher viscosity encapsulation material, however, is subject to the formation of voids as previously noted, which voids can cause delamination from the semiconductor device and can cause a "popcorn effect" as trapped water condensation vaporizes during subsequent processing.

As previously noted, FIG. 1 illustrates a semiconductor device 10 encapsulated using the de-wetting agent of the present invention. The surface of the encapsulation material 16 forms an angle of repose, $\alpha_B$, with respect to the surface of the substrate 14. Because of the presence of de-wetting agent 12, the encapsulation material 16 beads up on the surface of the substrate 14 rather than flowing or sagging. In addition, the angle of repose, $\alpha_b$, is equal to or greater than 90 degrees and the encapsulation material 16 does not "wet" the substrate 14. Because the encapsulation material does not wet the substrate, the encapsulation material remains thicker over the surfaces 18 of the semiconductor device 10, which protects the semiconductor device. Thus, by forming a film or thin layer of de-wetting agent at the boundary of the encapsulation material, the encapsulation material does not wet the substrate surface and a low viscosity encapsulation material may be used.

The de-wetting agent may be selected from a number of suitable commercially available materials including silicones, latex compounds, and high-molecular weight waxes.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of encapsulating a semiconductor device, comprising:

providing a carrier substrate supporting said semiconductor device;

applying a de-wetting agent on said carrier substrate in a predetermined pattern; and applying an encapsulant material over said semiconductor device in a volume sufficient to cause an angle or repose greater than 90 degrees to form at a periphery of said encapsulant material adjacent said de-wetting agent.

2. The method of claim 1, wherein said predetermined pattern includes an area bordering said semiconductor device.

3. The method of claim 2, wherein said de-wetting agent substantially surrounds said semiconductor device.

4. The method of claim 1, wherein applying said de-wetting agent includes:

placing a template, having at least one aperture, on said carrier substrate wherein said at least one aperture exposes a portion of said carrier substrate;

applying said de-wetting agent into said at least one template aperture; and removing said template.

5. The method of claim 1, wherein applying said de-wetting agent includes:

masking an area to be encapsulated on said carrier substrate with a masking material;

applying said de-wetting agent onto said carrier substrate; and removing said masking material.

6. The method of claim 5, wherein said masking material includes a physical mask material.

7. The method of claim 5, wherein said masking material includes a resist-type material.

8. The method of claim 7, wherein removing said masking material includes washing said masking material with a solvent.

9. The method of claim 1, wherein applying said de-wetting agent includes:

applying a predimensioned de-wetting agent film onto said carrier substrate.

10. The method of claim 1, wherein a cohesive force between molecules of said encapsulant material is greater than an adhesive force between the molecules of said encapsulant material and molecules of said de-wetting agent.

* * * * *

UNITED STATES PATENT AND TRADEMARK OFFICE
CERTIFICATE OF CORRECTION

PATENT NO : 5,885,854
DATED : March 23, 1999
INVENTOR(S) : Richard W. Wensel

It is certified that error appears in the above-identified patent and that said Letters Patent are hereby corrected as shown below:

On the Title Page:

Column 2, last listed U.S. Patent Document, change "5,577,819" to --5,577,319--.

| | | |
|---|---|---|
| Column 1, | line 24, | change "flip chip bumps" to --flip-chip bumps--; |
| Column 1, | line 46, | change "tile" to --the--; |
| Column 1, | line 47, | change "encapsulant" to --encapsulation--; |
| Column 1, | line 50, | change "encapsulant" to --encapsulation--; |
| Column 1, | line 52, | change "encapsulant" to --encapsulation--; |
| Column 1, | line 66, | after "which" insert --,-- and after "least" insert --,--; |
| Column 2, | line 20, | after "of" insert --the low viscosity encapsulation--; |
| Column 2, | line 47, | after "substrate" insert --,-- and after "PCB" insert --,--; |
| Column 3, | line 39, | change "bead up" to --"bead up."--; |
| Column 3, | line 45, | change "repose $\alpha_b$," to --repose $\alpha_B$--; |
| Column 3, | line 49, | change "show" to --shown--; |
| Column 3, | line 60, | after "is" insert --,-- and after "course" insert --,--; |
| Column 3, | line 66, | change "film" to --de-wetting agent--; |
| Column 4, | line 7, | change "encapsulant" to --encapsulation--; |
| Column 4, | line 8, | change "encapsulant" to --encapsulation-- and after "side" insert --exterior-- |

UNITED STATES PATENT AND TRADEMARK OFFICE
CERTIFICATE OF CORRECTION

PATENT NO : 5,885,854
DATED : March 23, 1999
INVENTOR(S) : Richard W. Wensel

It is certified that error appears in the above-identified patent and that said Letters Patent are hereby corrected as shown below:

| | | |
|---|---|---|
| Column 4, | line 16, | after "therefore" insert --,--; |
| Column 4, | line 27, | change "de-wetting agent 16" to --de-wetting agent 12--; |
| Column 4, | line 42, | after "therefore" insert --,--; |
| Column 4, | line 52, | after "the" insert --de-wetting--; |
| Column 5, | line 60, | change "repose $\alpha_b$," to --repose $\alpha_B$--; and |
| Column 5, | line 64, | after "the" (first occurrence) insert --exterior--. |

Signed and Sealed this

Tenth Day of April, 2001

Attest:

NICHOLAS P. GODICI

*Attesting Officer*     *Acting Director of the United States Patent and Trademark Office*